United States Patent
Metzner et al.

(10) Patent No.: US 7,067,439 B2
(45) Date of Patent: Jun. 27, 2006

(54) ALD METAL OXIDE DEPOSITION PROCESS USING DIRECT OXIDATION

(75) Inventors: Craig R. Metzner, Fremont, CA (US); Shreyas S. Kher, Campbell, CA (US); Vidyut Gopal, Santa Clara, CA (US); Shixue Han, Milpitas, CA (US); Shankarram A. Athreya, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 91 days.

(21) Appl. No.: 10/247,103

(22) Filed: Sep. 19, 2002

(65) Prior Publication Data

US 2003/0232511 A1    Dec. 18, 2003

Related U.S. Application Data

(60) Provisional application No. 60/388,929, filed on Jun. 14, 2002.

(51) Int. Cl.
 *H01L 21/31* (2006.01)

(52) U.S. Cl. .............................. 438/785; 257/E21.006; 427/249.19

(58) Field of Classification Search .............. 438/780, 438/781, 785, 758, 770, 788, 789, 790, 792–794, 438/778, 784; 148/DIG. 110; 427/539, 427/544, 584, 569, 576, 248.1, 249.19; 257/E21.001, 257/E21.006
See application file for complete search history.

(56) References Cited

U.S. PATENT DOCUMENTS

| | | | |
|---|---|---|---|
| 5,290,609 A | 3/1994 | Horiike et al. ............. 427/576 |
| 5,916,365 A | 6/1999 | Sherman ..................... 117/92 |
| 6,013,553 A | 1/2000 | Wallace et al. ............. 438/287 |
| 6,020,243 A | 2/2000 | Wallace et al. ............. 438/287 |
| 6,060,755 A | 5/2000 | Ma et al. |
| 6,174,809 B1 | 1/2001 | Kang et al. ................ 438/682 |
| 6,200,893 B1 | 3/2001 | Sneh ........................ 438/685 |
| 6,203,613 B1 | 3/2001 | Gates et al. ............... 117/104 |
| 6,207,487 B1 | 3/2001 | Kim et al. .................. 438/238 |
| 6,238,734 B1 | 5/2001 | Senzaki et al. ............ 427/226 |
| 6,270,572 B1 | 8/2001 | Kim et al. .................. 117/93 |
| 6,287,965 B1 | 9/2001 | Kang et al. ................ 438/648 |
| 6,291,283 B1 | 9/2001 | Wilk ......................... 438/216 |
| 6,297,539 B1 | 10/2001 | Ma et al. ................... 257/410 |
| 6,299,294 B1 | 10/2001 | Regan ....................... 347/62 |
| 6,305,314 B1 | 10/2001 | Sneh et al. ............... 118/723 R |
| 6,342,277 B1 | 1/2002 | Sherman ................... 427/562 |

(Continued)

FOREIGN PATENT DOCUMENTS

EP    1 126 046    8/2001

(Continued)

OTHER PUBLICATIONS

U.S. Appl. No. 60/326,830 filed on Oct. 2, 2001.*

(Continued)

*Primary Examiner*—Brook Kebede
(74) *Attorney, Agent, or Firm*—Patterson & Sheridan, LLP

(57) ABSTRACT

Methods of forming metal compounds such as metal oxides or metal nitrides by sequentially introducing and then reacting metal organic compounds with ozone or with oxygen radicals or nitrogen radicals formed in a remote plasma chamber. The metal compounds have surprisingly and significantly improved uniformity when deposited by atomic layer deposition with cycle times of at least 10 seconds. The metal compounds also do not contain detectable carbon when the metal organic compound is vaporized at process conditions in the absence of solvents or excess ligands.

25 Claims, 4 Drawing Sheets

U.S. PATENT DOCUMENTS

| | | | |
|---|---|---|---|
| 6,348,386 B1 | 2/2002 | Gilmer | 438/288 |
| 6,372,598 B1 | 4/2002 | Kang et al. | 438/399 |
| 6,391,785 B1 | 5/2002 | Satta et al. | 438/704 |
| 6,391,803 B1 | 5/2002 | Kim et al. | 438/787 |
| 6,395,650 B1 | 5/2002 | Callegari et al. | 438/785 |
| 6,395,690 B1 | 5/2002 | Tsaur | 510/130 |
| 6,399,491 B1 | 6/2002 | Jeon et al. | 438/680 |
| 6,416,577 B1 | 7/2002 | Suntoloa et al. | 117/88 |
| 6,420,279 B1 | 7/2002 | Ono et al. | 438/785 |
| 6,451,119 B1 | 9/2002 | Sneh et al. | 118/715 |
| 6,451,695 B1 | 9/2002 | Sneh | 438/685 |
| 6,452,229 B1 | 9/2002 | Krivokapic | 257/330 |
| 6,475,276 B1 | 11/2002 | Elers et al. | 117/84 |
| 6,475,910 B1 | 11/2002 | Sneh | 435/685 |
| 6,482,262 B1 | 11/2002 | Elers et al. | 117/84 |
| 6,599,572 B1 | 7/2003 | Saanila et al. | 427/249.18 |
| 6,620,723 B1 | 9/2003 | Byun et al. | |
| 6,630,201 B1 | 10/2003 | Chiang et al. | |
| 6,674,138 B1 | 1/2004 | Halliyal et al. | |
| 6,803,272 B1 | 10/2004 | Halliyal et al. | |
| 2001/0000866 A1 | 5/2001 | Sneh et al. | 118/723 R |
| 2001/0002280 A1 | 5/2001 | Sneh | 427/255.28 |
| 2001/0009695 A1 | 7/2001 | Saanila et al. | 427/255.39 |
| 2001/0021589 A1 | 9/2001 | Wilk | 438/778 |
| 2001/0024387 A1 | 9/2001 | Raaijmakers et al. | 365/200 |
| 2001/0029092 A1 | 10/2001 | Park et al. | |
| 2001/0029891 A1 | 10/2001 | Oh et al. | 118/722 |
| 2002/0000598 A1 | 1/2002 | Kang et al. | 257/301 |
| 2002/0005556 A1 | 1/2002 | Cartier et al. | 257/381 |
| 2002/0008297 A1 | 1/2002 | Park et al. | 257/510 |
| 2002/0014647 A1 | 2/2002 | Seidl et al. | 257/301 |
| 2002/0015790 A1 | 2/2002 | Baum et al. | 427/255.28 |
| 2002/0029092 A1 | 3/2002 | Gass | 700/116 |
| 2002/0043666 A1 | 4/2002 | Parsons et al. | 257/200 |
| 2002/0064970 A1 | 5/2002 | Chooi et al. | 438/785 |
| 2002/0076837 A1 | 6/2002 | Hujanen et al. | 438/3 |
| 2002/0081826 A1 | 6/2002 | Rotondaro et al. | 438/585 |
| 2002/0081844 A1 | 6/2002 | Jeon et al. | 438/680 |
| 2002/0086111 A1 | 7/2002 | Byun et al. | 427/255.394 |
| 2002/0093046 A1 | 7/2002 | Moriya et al. | 257/315 |
| 2002/0093781 A1 | 7/2002 | Bachhofer et al. | 361/312 |
| 2002/0098627 A1 | 7/2002 | Pomarede et al. | 438/149 |
| 2002/0106536 A1 | 8/2002 | Lee | 428/702 |
| 2002/0146895 A1 | 10/2002 | Ramdani et al. | 438/497 |
| 2002/0151152 A1 | 10/2002 | Shimamoto et al. | 438/398 |
| 2002/0153579 A1 | 10/2002 | Yamamoto | 257/412 |
| 2002/0155722 A1 | 10/2002 | Satta et al. | 438/704 |
| 2002/0172768 A1 | 11/2002 | Endo et al. | 427/255.28 |
| 2002/0175393 A1* | 11/2002 | Baum et al. | 257/596 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0195643 A1 | 12/2002 | Harada | |
| 2002/0197881 A1 | 12/2002 | Ramdani et al. | 438/764 |
| 2003/0031807 A1 | 2/2003 | Elers et al. | 427/569 |
| 2003/0049931 A1 | 3/2003 | Byun et al. | |
| 2003/0049942 A1 | 3/2003 | Haukka et al. | 438/778 |
| 2003/0072975 A1 | 4/2003 | Shero et al. | 428/704 |
| 2003/0082296 A1 | 5/2003 | Elers et al. | 427/96 |
| 2003/0082301 A1 | 5/2003 | Chen et al. | |
| 2003/0089942 A1 | 5/2003 | Bhattachyrra | 257/310 |
| 2003/0096473 A1 | 5/2003 | Shih et al. | |
| 2003/0104710 A1 | 6/2003 | Visokay, et al. | 438/798 |
| 2003/0106490 A1 | 6/2003 | Jallepally et al. | |
| 2003/0109114 A1 | 6/2003 | Niwa | 438/431 |
| 2003/0116804 A1 | 6/2003 | Visokay et al. | 257/350 |
| 2003/0133861 A1 | 7/2003 | Bowen et al. | |
| 2003/0160277 A1 | 8/2003 | Bhattacharyya | 257/310 |
| 2003/0168750 A1 | 9/2003 | Basceri et al. | 257/915 |
| 2003/0173586 A1 | 9/2003 | Moriwaki et al. | 257/200 |
| 2003/0185980 A1 | 10/2003 | Endo | 427/255.23 |
| 2003/0186495 A1 | 10/2003 | Saanila et al. | 438/200 |
| 2003/0188682 A1 | 10/2003 | Tois et al. | 117/105 |
| 2003/0190423 A1 | 10/2003 | Yang et al. | |
| 2003/0194853 A1 | 10/2003 | Jeon | 438/591 |
| 2003/0205729 A1 | 11/2003 | Basceri et al. | 257/200 |
| 2003/0213987 A1 | 11/2003 | Basceri et al. | |
| 2003/0227033 A1 | 12/2003 | Ahn et al. | |
| 2003/0232501 A1 | 12/2003 | Kher et al. | |
| 2003/0232506 A1 | 12/2003 | Metzner et al. | |
| 2003/0232511 A1 | 12/2003 | Metzner et al. | |
| 2003/0234417 A1 | 12/2003 | Raaijmakers et al. | |
| 2003/0235961 A1 | 12/2003 | Metzner et al. | |
| 2004/0007747 A1 | 1/2004 | Visokay et al. | |
| 2004/0009370 A1 | 1/2004 | Koh et al. | |
| 2004/0009675 A1 | 1/2004 | Eissa et al. | |
| 2004/0016973 A1 | 1/2004 | Rotondaro et al. | |
| 2004/0018723 A1 | 1/2004 | Byun et al. | |
| 2004/0018747 A1 | 1/2004 | Lee et al. | |
| 2004/0023461 A1 | 2/2004 | Ahn et al. | |
| 2004/0023462 A1 | 2/2004 | Rotondaro et al. | |
| 2004/0028952 A1 | 2/2004 | Cartier et al. | |
| 2004/0029321 A1 | 2/2004 | Ang et al. | |
| 2004/0033698 A1 | 2/2004 | Lee et al. | |
| 2004/0036111 A1 | 2/2004 | Nishikawa et al. | |
| 2004/0038554 A1 | 2/2004 | Ahn et al. | |
| 2004/0040501 A1 | 3/2004 | Vaartstra | |
| 2004/0043149 A1 | 3/2004 | Gordon et al. | |
| 2004/0043569 A1 | 3/2004 | Ahn et al. | |
| 2004/0043630 A1 | 3/2004 | Vaarstra et al. | |
| 2004/0046197 A1 | 3/2004 | Basceri et al. | |
| 2004/0048491 A1 | 3/2004 | Jung et al. | |
| 2004/0051152 A1 | 3/2004 | Nakajima | |
| 2004/0053484 A1 | 3/2004 | Kumar et al. | |
| 2004/0216670 A1 | 11/2004 | Gutsche et al. | |
| 2005/0212119 A1* | 9/2005 | Shero et al. | 257/705 |

FOREIGN PATENT DOCUMENTS

| | | |
|---|---|---|
| EP | 1 146 141 | 10/2001 |
| EP | 1170804 | 1/2002 |
| EP | 1 321 973 | 6/2003 |
| GB | 2355727 | 5/2001 |
| JP | 59174535 | * 10/1984 |
| JP | 2001-172767 | 6/2001 |
| JP | 2002-69641 | 3/2002 |
| JP | 2002-69641 A | 3/2002 |
| JP | 2002-172767 | 6/2002 |
| JP | 2001-111000 | 12/2002 |
| WO | 99/29924 | 6/1999 |
| WO | WO 00/13235 | 3/2000 |
| WO | 00/54320 | 9/2000 |
| WO | 00 70674 | 11/2000 |
| WO | 01/15220 | 3/2001 |
| WO | 01 25502 | 4/2001 |
| WO | 01/27346 | 4/2001 |
| WO | 01/27347 | 4/2001 |
| WO | 01/29280 | 4/2001 |
| WO | 01/29891 | 4/2001 |
| WO | 01/29893 | 4/2001 |
| WO | WO 01/29891 A1 | 4/2001 |
| WO | 01 40541 | 6/2001 |
| WO | 01/66832 | 9/2001 |
| WO | 01 82390 | 11/2001 |
| WO | WO 01/99166 | 12/2001 |
| WO | 02 09167 | 1/2002 |
| WO | WO 02/01628 | 1/2002 |
| WO | 02 27063 | 4/2002 |
| WO | 02 43115 | 5/2002 |
| WO | 02/45167 | 6/2002 |

OTHER PUBLICATIONS

Niinisto, et al. *"Synthesis of oxide thin films and overlayers by atomic layer epitaxy for advance applications,"* Materials Science and Engineering B41 (1996) 23-29.

Hendrix, et al., "Composition Control of $Hf_{1-x}Si_xO$ Films Deposited on Si by Chemical-vapor Deposition Using Amide Precursors," Applied Physics Letters, vol. 80, No. 13 (Apr. 1, 2002).

Cheon, et al. "Gas Phase Photoproduction of Diatomic Metal Nitrides During Metal Nitride Laser Chemical Vapor Deposition," Inorg. Chem. 1999, 38, 2238-2239.

Ohshita, et al. "$HfO_2$ Growth by Low-pressure Chemical Vapor Deposition Using the $Hf(N(C_2H_5)_2)_4/O_2$ Gas System," Journal of Crystal Growth 233 (2001) 292-297.

Balog, et al. "Chemical Vapor Deposition and Characterization of $HfO_2$ Films from Organo-Hafnium Compounds," Thin Solid Films, 41 (1977) 247-259.

Ritala, et al. Acad. Sci. Fenn. Ser. A II. Chemica 257 (1994) pp. 1-48.

Kattelus, et al. "Electrical Properties of Tantalum Based Composite Oxide Films," Mat. Res. Soc. Symp. Proc., 284 (1993) 511-516.

Kukli, et al. "Tailoring the Dielectric Properties of $HfO_2$-$Ta_2O_5$ Nanolaminates," Applied Physics Letters, vol. 68, No. 26 (Jun. 24, 1996), pp. 3737-3739.

Ritala, et al., "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

George, et al. "Surface Chemistry for Atomic Layer Growth," J. Phys. Chem. (1996), 100, 13121-13131.

Niinisto, et al. "Synthesis of Oxide Thin Films and Overlayers by Atomic Layer Epitaxy for Advanced Applications," Materials Science and Engineering B41 (1996) 23-29.

Hwang, et al. "Nanometer-Size ÿ $PbO_2$-type $TiO_2$ in Garnet: A Thermobarometer for Ultrahigh-Pressure Metamorphism," Science Vo. 288 (Apr. 14, 2000).

Argarwal, et al. "Challenges in Integrating the High-K Gate Dielectric Film to the Conventional CMOS Process Flow," Mat. Sec. Soc. Sump. Proc. vol. 670 (2001).

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

"A Novel Atomic Layer Deposition Process to Deposit Hafnium Silicate Thin Films", Senzaki, Yoshihide, et al., Electrochemical Society Proceedings vol. 2004-01, pp. 264-70.

"Nitridation of Hanium Silicate Thin Films", Chatham, Hood; et al., Mat. Res. Soc. Symp. Proc. vol. 811, Apr. 12-16, 2004, D7.5.1.

"Interval Annealing During Alternating Pulse Deposition", Conley, J.F.; et al., Mat. Res. Soc. Symp. Proc. vol. 811, Apr. 12-16, 2004, D1.3.1.

Ho, et al., "Suppressed crystallization of Hf-based gate dielectrics by controlled addition of Al2O3 using atomic layer deposition", Applied Physics Letters, American Institute of Physics, New York, US, vol. 81, No. 22, Nov. 25, 2002, pp. 4218-4220.

Kawahara, et al., "effects of Hf sources, oxidizing agents, and NH3 radicals on properties of $HfAlO_x$ films prepared by atomic layer deposition", IWGI 2003, TOKYO, Nov. 6, 2003, pp. 32-37.

Kukli, et al., "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Ohshita, et al., "$Hf_{1-x}Si_xO_2$ deposition by metal organic chemical vapor deposition using the $Hf)NEt_2)_4/SiH(NEt_2)_3/O_2$ gas system", Preparation and Characterization, Elsevier Sequioa, NL, vol. 416, No. 1-2, Sep. 2, 2002, pp. 208-211.

Visokay, et al., "Application of HfSiON as a gate dielectric material", Applied Physics Letter, American Institute of Physics, New York, US, vol. 80, No. 17, Apr. 29, 2002, pp. 3183-3185.

* cited by examiner

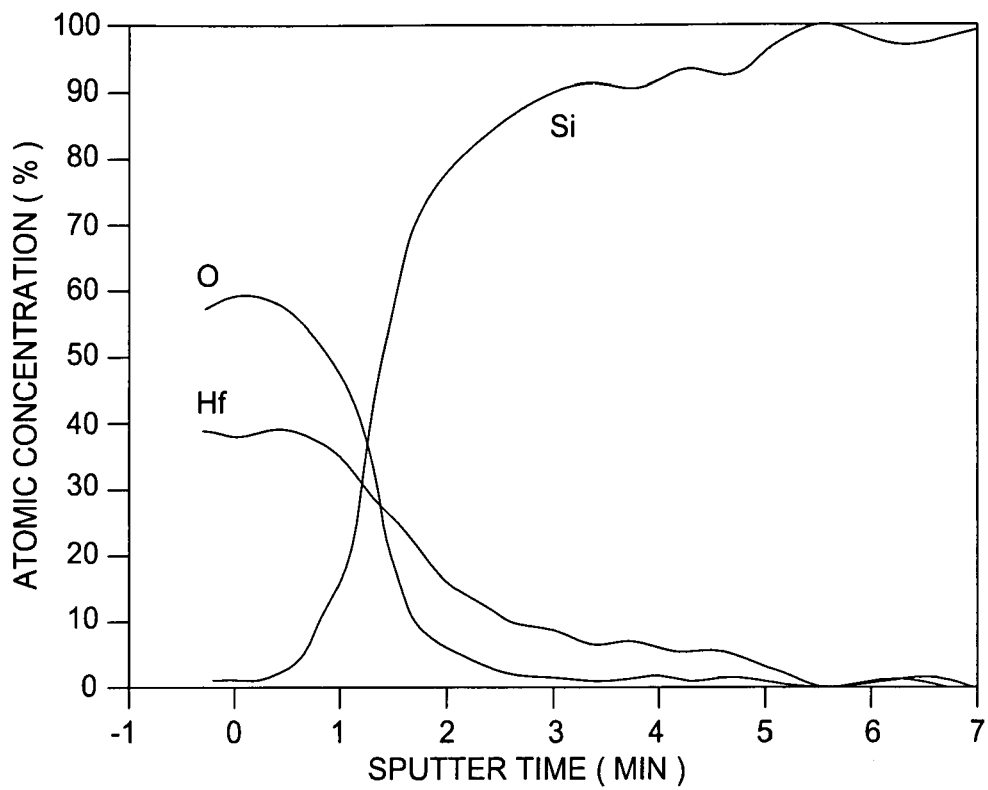
FIG. 6
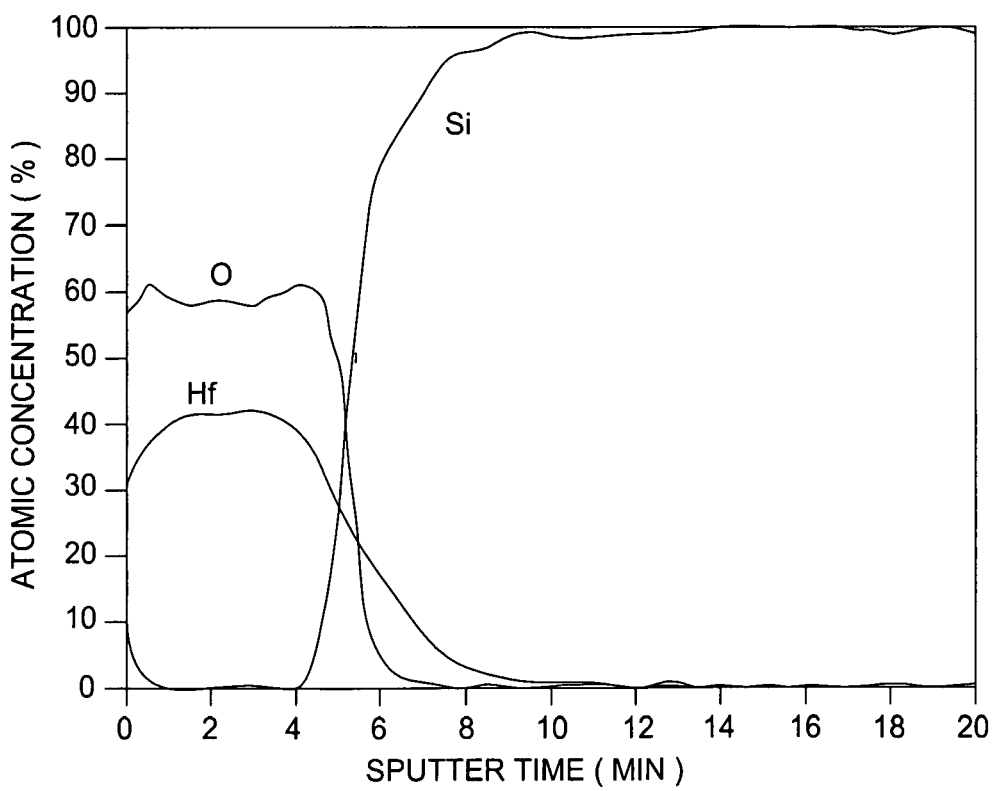
FIG. 7 (COMPARISON)

ALD METAL OXIDE DEPOSITION PROCESS USING DIRECT OXIDATION

This application claims priority, from U.S. Provisional Application Ser. No. 60/388,929 filed Jun. 14, 2002, entitled, "ALD Metal Oxide Deposition Process Using Direct Oxidation". The foregoing patent application, which is assigned to the assignee of the present application, is incorporated herein by reference in its entirety.

BACKGROUND OF THE INVENTION

1. Field of the Invention

Embodiments of the present invention relate to deposition methods for forming thin films of metal compounds, such as metal oxides or metal nitrides, on substrates for use in manufacturing semiconductor devices, flat-panel display devices, and other electronic devices.

2. Description of the Related Art

In the field of semiconductor processing, flat-panel display processing or other electronic device processing, chemical vapor deposition has played an important role in forming films on substrates. As the geometries of electronic devices continue to shrink and the density of devices continues to increase, the size and aspect ratio of the features are becoming more aggressive, e.g., feature sizes of 0.07 microns and aspect ratios of 10 or greater are contemplated. Accordingly, conformal deposition of materials to form these devices is necessary.

While conventional chemical vapor deposition has proven successful for device geometries and aspect ratios up to 0.15 microns, the more aggressive device geometries require new, innovative deposition techniques. Techniques that are receiving considerable attention include rapid cycle (pulsed) CVD and atomic layer deposition (ALD). In such schemes, reactants are introduced sequentially into a processing chamber where each reactant adsorbs onto the surface of the substrate where a surface reaction occurs. A purge step is typically carried out between the delivery of each reactant gas. The purge step may be a continuous purge with the reactant gases or a pulse purge between the delivery of the reactant gases.

Deposition of metal compounds from metal organic compounds typically results in trace amounts of carbon in the deposited film. The carbon is introduced into the film from the organic groups on the metal organic compound or a solvent such as toluene that may be added to assist in vaporizing the metal organic compound, or both. Although atomic layer deposition enhances molecular reaction at the surface of the substrate between the metal organic precursors and reactive gases, the process temperatures and reaction times used for ALD typically do not reduce the carbon content below detectable limits. The residual carbon typically is an impurity that may migrate to surrounding layers.

U.S. Pat. No. 6,200,893, entitled "Radical-assisted Sequential CVD" describes a method for CVD deposition on a substrate where radical species such as hydrogen and oxygen or hydrogen and nitrogen are introduced into a processing chamber in an alternating sequence with a precursor. Each compound, the radical species and the precursor, are adsorbed onto the substrate surface. The result of this process is two-fold; the components react with each other, as well as prepare the substrate surface with another layer of compound for the next step. By repeating the cycles, a film of desired thickness is produced. In a preferred embodiment the depositions from the molecular precursor are metals, and the radicals in the alternate steps are used to remove ligands left from the metal precursor reactions, as well as to oxidize or nitridize the metal surface in subsequent layers. However, the reference does not address removal of carbon from metal compounds produced from metal organic compounds.

Therefore, there is a need for a process for depositing metal compounds such as metal oxides and metal nitrides from metal organic compounds to provide thin films that do not have detectable carbon.

SUMMARY OF THE INVENTION

The present invention provides deposition processes in which metal organic compounds comprising the structure $M(NR'R")_n$, where n=1–4, are sequentially deposited on a substrate surface and reacted with ozone or a reactive oxygen or nitrogen species formed in a remote plasma chamber. Atomic layer deposition is the preferred deposition process and is obtained by controlling processing conditions such as temperature and pulse cycles. The metal organic compounds preferably exist in a gaseous state at process conditions and can be vaporized without addition of solvents.

An exemplary embodiment of the invention deposits surprisingly uniform films of hafnium oxide from compounds that include the structure $Hf(NR'R)_4$, wherein either or both of R' and R is an alkyl group having from one to four carbon atoms, and where R' and R may be the same group or may be different groups. A preferred compound is tetrakis (diethylamido)hafnium (TDEAH). In a pulsed atomic layer deposition process, the TDEAH is adsorbed on a substrate surface at a temperature less than 220° C. and then reacted with ozone or oxygen radicals generated in a remote plasma chamber. A pulse time of about 12 seconds or less significantly and surprisingly provides uniform hafnium oxide film deposition which can be used to form conventional semiconductor films such as high k gate dielectric layers or high k capacitor dielectric layers.

BRIEF DESCRIPTION OF THE DRAWINGS

FIG. 6 shows that carbon is not detectable in the hafnium oxide film using the ALD method of the present invention; and FIG. 7 (Comparison) shows that carbon is detectable in a hafnium oxide film produced from the precursor of FIG. 2 using MOCVD.

DETAILED DESCRIPTION OF THE INVENTION

Embodiments of the present invention relate to an atomic layer deposition or a rapid chemical vapor deposition process for forming a thin layer of a metal compound on a substrate. A metal organic precursor comprising the structure $M(NR'R)_n$, where n=1–4, and where at least one of R and R' is an organic group, is introduced into a processing chamber, adsorbed on a substrate surface, then reacted with ozone or with another reactive oxygen species formed in a remote plasma chamber.

Figure 1:
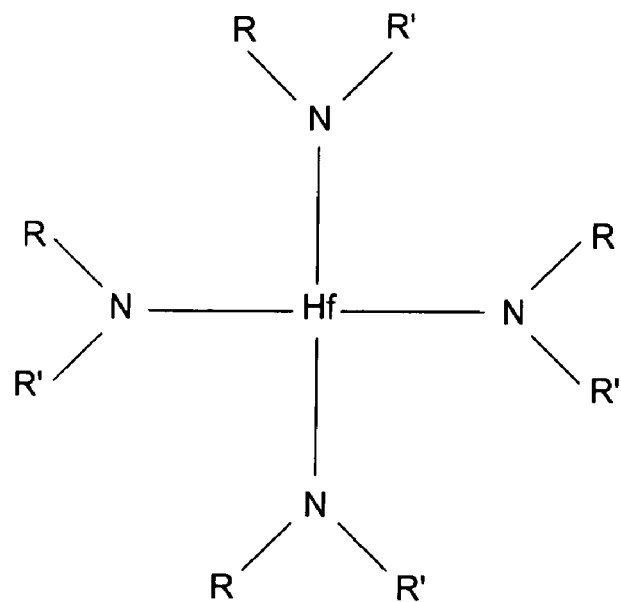
FIG. 1 is a generic structure for tetrakis(dialkylamido) hafnium compounds which are preferred metal organic precursors for the first and second embodiments of the present invention.
Figure 2:
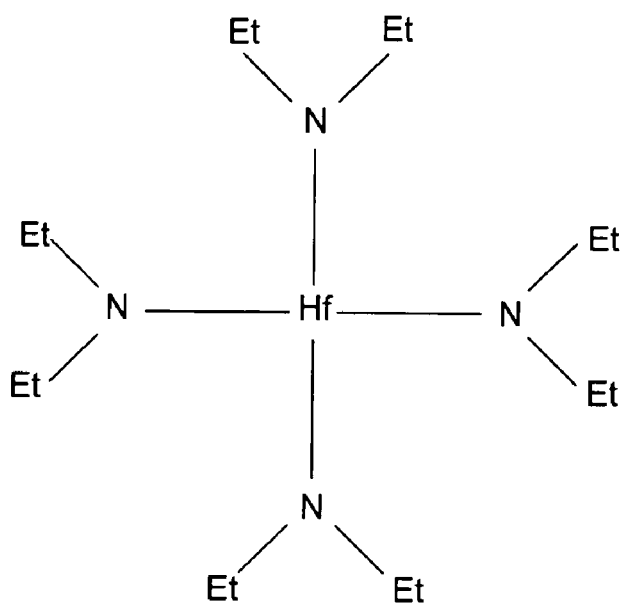
FIG. 2 is tetrakis(diethylamido)hafnium (TDEAH), a compound used in the examples of the present invention.

The deposited metal compounds do not contain detectable amounts of carbon. Removal of detectable carbon is aided by the absence of solvents and excess ligands in the metal organic precursors. The preferred metal organic precursors are hafnium compounds having the structure shown in FIG. 1 wherein both R and R' are an alkyl group having from one to four carbon atoms. Most preferably, R and R' are the same alkyl group. The most preferred metal organic compounds include tetrakis(diethylamido)hafnium (TDEAH), which is shown in FIG. 2 and is commercially available.

In order to form a conformal film on a substrate from TDEAH by atomic layer deposition, the substrate is heated to a temperature of between about 150° C. and about 220° C. The TDEAH is pulsed into the chamber through the gas delivery system using a carrier gas, such as nitrogen or argon, at a pressure from 0.1 Torr to 10 Torr. The pulse of TDEAH requires less than 12 seconds to deposit an adequate amount of TDEAH on the substrate surface under the conditions described; however one skilled in the art recognizes that the TDEAH pulse need only be long enough so that substantially a monolayer of TDEAH is deposited. Following the pulse of TDEAH, the carrier gas/TDEAH flow is discontinued, and a pulse of a purge gas, such as nitrogen, helium or argon, is introduced. The pulse of the purge gas may last for about 12 seconds or less, and need only be long enough to clear the excess TDEAH from the chamber.

Next, the purge gas pulse is terminated, and a reactive gas comprising ozone or other reactive oxygen species from a remote plasma chamber is pulsed into the chamber with a carrier gas. For reactive oxygen, the carrier gas is preferably argon or helium, either of which assists in maintaining a stable oxygen plasma. It takes a reactive gas/carrier pulse of less than about 12 seconds to react with the TDEAH to form hafnium oxide or hafnium nitride, but again, the pulse need only be long enough so that substantially a monolayer of reactive oxygen is deposited. After the reactive oxygen gas/carrier pulse, another pulse of purge gas is introduced into the chamber, and, as before, the time of the pulse of the purge gas need only be long enough to clear the unreacted reactive oxygen from the chamber. The pulse of the TDEAH/carrier, the pulse of the first purge gas, the pulse of the reactive oxygen gas/carrier, and the pulse of the second purge gas completes one sequential deposition cycle. The deposition cycles are repeated until a desired thickness of the hafnium oxide or hafnium nitride has been deposited. The time per cycle will vary depending on substrate or chamber size and other hardware parameters, on chamber conditions such as temperature and pressure and on the selection of precursor and reactive gas.

Figure 3:
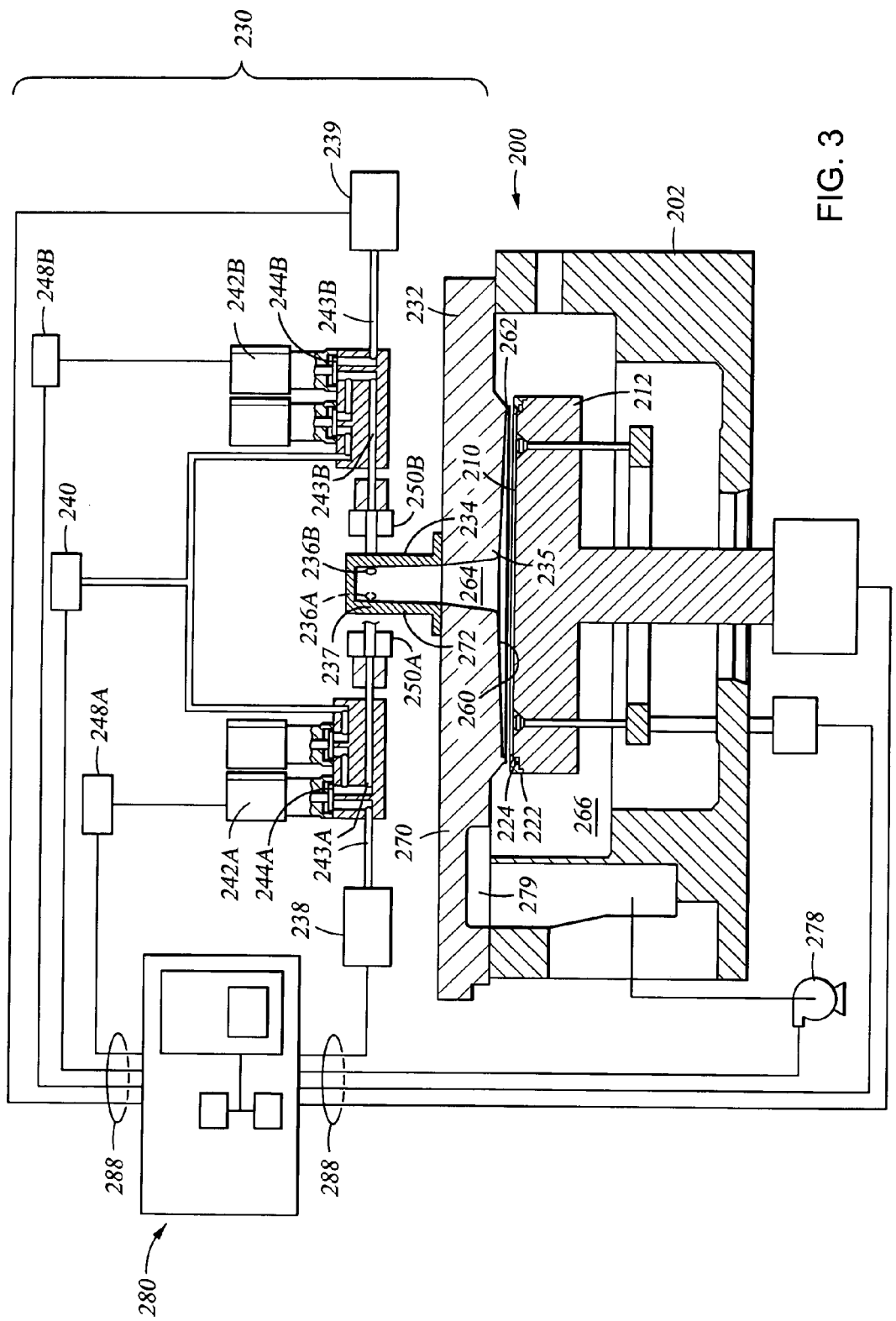
FIG. 3 is a cross sectional view of one processing chamber which can be used to advantage to deposit a metal compound according to embodiments of the invention.

FIG. 3 is a schematic cross-sectional view of one embodiment of a processing chamber 200 which can be used to form films according to embodiments described herein. The chamber 200 includes a chamber body 202 and a movable substrate support 212 disposed in the chamber to support a substrate 210. The substrate support 212 may include a vacuum chuck, an electrostatic chuck, or a clamp ring for securing the substrate 212 to the substrate support 212 during processing. The substrate support 212 may be heated using an embedded heating element, such as a resistive heater, or may be heated using radiant heat, such as heating lamps disposed above the substrate support 212. A purge ring 222 may be disposed on the substrate support 212 to define a purge channel 224 which provides a purge gas to a peripheral portion of the substrate 210 to prevent deposition thereon.

The chamber 200 includes a vacuum system 278 in communication with a pumping channel 279 to evacuate any desired gases from the chamber 200 and to help maintain a desired pressure or a desired pressure range inside a pumping zone 266 of the chamber 200.

A gas delivery apparatus 230 is disposed at an upper portion of the chamber body 202 to introduce the metal precursors, the reactive gases and the purge gases into the chamber 200. The gas delivery apparatus 230 comprises a chamber lid 232 which includes an expanding channel 234 and a bottom surface 260. The bottom surface 260 is sized and shaped to substantially cover a substrate 210 disposed on the substrate support 212. The expanding channel 234 has gas inlets 236A, 236B to provide gas flows from two similar valves 242A, 242B via valve seat assemblies 244A, 244B and delivery lines 243A, 243B. The gas flows from the valves 242A, 242B may be provided together and/or separately. The valves 242A, 242B may be pneumatically actuated or may be electrically actuated. Programmable logic controller 248A, 248B may be coupled to the valves 242A, 242B to control actuation of the valves 242A, 242B. An electrically actuated valve typically requires the use of a driver coupled between the valve and the programmable logic controller. The valves 242A, 242B may be zero dead volume valves to enable rapid flushing of a reactant gas from the delivery lines of the valve 242A, 242B.

Valves 242A and 242B are coupled to one or the other of the separate precursors. Each is coupled to a purge gas source, preferably the same purge gas source. For example, valve 242A is coupled to precursor gas source 238 and valve 242B is coupled to reactant gas source 239, and both valves 242A, 242B are coupled to purge gas source 240. Each valve 242A, 242B may be adapted to provide a combined gas flow and/or separate gas flows of the precursor gas source 238 or reactant gas source 239 and the purge gas source 240. The reactant gas source 239 includes remote plasma generation such as a microwave chamber to generate reactive gas species when desired.

In reference to valve 242A, one example of a combined gas flow of the precursor gas source 238 and the purge gas source 240 provided by valve 242A comprises a continuous flow of a purge gas from the purge gas source 240 and pulses of a reactant gas from the precursor gas source 238. In reference to valve 242A, one example of separate gas flows of the reactant gas source 238 and the purge gas 240 provided by valve 242A comprises pulses of a purge gas from the purge gas source 240 and pulses of a reactant gas from the reactant gas source 238.

The delivery lines of the valves 242A, 242B may be coupled to the gas inlets 236A, 236B through gas conduits 250A, 250B. Each gas conduit 250A, 250B and gas inlet 236A, 236B may be positioned in any relationship to the expanding channel. Each gas conduit 250A, 250 B and gas inlet 236A, 236B are preferably positioned normal (in which $+\beta$, $-\beta$=to 90°) to the longitudinal axis of the expanding channel or positioned at an angle $+\beta$ or an angle $-\beta$ (in which $0°<+\beta<90°$; $0°<-\beta<90°$) from a centerline of the gas conduit 250A, 250B to the longitudinal axis of the expanding channel. Therefore, the gas conduit 250A, 250B may be positioned horizontally normal to the longitudinal axis of the expanding channel, may be angled downwardly at an angle +β, or may be angled upwardly at an angle −β to provide a gas flow toward the walls of the expanding channel 234 rather than directly downward towards the substrate 210 which helps reduce the likelihood of blowing off reactants absorbed on the surface of the substrate 210. In addition, the diameter of the gas conduits 250A, 250B may be increasing from the delivery lines of the valves 242A, 242B to the gas inlets 236A, 236B to help reduce the velocity of the gas flow prior to its entry into the expanding channel 234. For example, the gas conduits 250A, 250B may comprise an inner diameter which is gradually increasing or may comprise a plurality of connected conduits having increasing inner diameters. The expanding channel 234 comprises a channel which has an inner diameter which increases from an upper portion 237 to a lower portion 235 adjacent the bottom surface 260 of the chamber lid 232. In one aspect, the diameter of the expanding channel 234 is gradually increasing from the upper portion 237 to the lower portion 235 of the expanding channel to allow less of an adiabatic expansion of a gas through the expanding channel 234 which helps to control the temperature of the gas. In one embodiment, the gas inlets 236A, 236B are located adjacent the upper portion 237 of the expanding channel 234.

At least a portion of the bottom surface 260 of the chamber lid 232 from the expanding channel 234 may be downwardly slopping or funnel shaped to help provide an improved velocity profile of a gas flow from the expanding channel 234 across the surface of the substrate 210 (i.e., from the center of the substrate to the edge of the substrate). In one aspect, the bottom surface 260 is downwardly sloping to help reduce the variation in the velocity of the gases as it travels between the bottom surface 260 of the chamber lid 232 and the substrate 210 to help provide uniform exposure of the surface of the substrate 210 to a precursor or reactant gas.

The chamber lid 232 may have a choke 262 at a peripheral portion of the chamber lid 232 adjacent the perimeter of the substrate 210. The choke 262 may comprise any circumferential downwardly extending protrusion. The choke 262 helps provide a more uniform pressure distribution within the volume or a reaction zone 264 defined between the chamber lid 232 and the substrate 210 by isolating the reaction zone 264 from the non-uniform pressure distribution of the pumping zone 266.

In one aspect, since the reaction zone 264 is isolated from the pumping zone 266, a minimal amount of gas adequately fills the reaction zone 264 to ensure sufficient exposure of the substrate 210 to the gas. In conventional chemical vapor deposition, a chamber is required to provide a combined flow of reactants simultaneously and uniformly to the entire surface of the substrate in order to ensure that the co-reaction of the reactants occur uniformly across the surface of the substrate. In atomic layer deposition based cyclical processing system, reactants are introduced sequentially into the chamber to provide adsorption of alternating thin layers of the reactants onto the surface of the substrate. Instead, a flow of a reactant needs to be provided repetitively in an amount that is sufficient to adsorb a thin layer of the reactant on the surface of the substrate. Since the reaction zone 264 may comprise a smaller volume when compared to the inner volume of a conventional CVD chamber, a smaller amount of gas is required to fill the reaction zone 264 for a particular process in an atomic layer deposition sequence. Because of the smaller volume of the reaction zone 264, less gas, whether a deposition gas or a purge gas, is necessary to be flowed into the chamber 200. Therefore, the throughput of the chamber 200 is greater and the waste may be minimized due to the smaller amount of gas used reducing the cost of operation.

The chamber lid 232, as shown, includes a cap portion 272 and a chamber plate portion 270 in which the cap portion 272 and the chamber plate portion 270 form the expanding channel 234. An additional plate may be optionally disposed between the chamber lid portion 270 and the cap portion 272. In other embodiments, the expanding channel 234 may be made integrally from a single piece of material.

The chamber lid 232 may include cooling elements and/or heating elements depending on the particular gas being delivered therethrough. Controlling the temperature of the chamber lid 232 may be used to prevent gas decomposition, deposition, or condensation on the chamber lid 232. For example, water channels may be formed in the chamber lid 232 to cool the chamber lid 232. In another example, heating elements may be embedded or may surround components of the chamber lid 232 to heat the chamber lid 232. In one embodiment, components of the chamber lid 232 may be individually heated or cooled. For example, referring to FIG. 3, the chamber lid 232 may comprise a chamber plate portion 270 and a cap portion 272 in which the chamber plate portion 270 and the cap portion 272 form the expanding channel 234. The cap may be maintained at one temperature range and the chamber lid may be maintained at another temperature range. For example, the cap 272 may be heated by being wrapped in heater tape or by using another heating device to prevent condensation of reactant gases and the chamber plate portion 270 may be maintained at ambient temperature. In another example, the cap 272 may be heated and the chamber plate portion may be cooled with water channels formed therethrough to prevent thermal decomposition of reactant gases on the chamber plate portion 270.

The chamber lid 232 may be made of stainless steel, aluminum, nickel-plated aluminum, nickel, or other suitable materials. In one embodiment, the cap portion 272 comprises stainless steal and the chamber plate portion 270 comprises aluminum. In one embodiment, the additional plate comprises stainless steal.

A control unit 280 may be coupled to the chamber 200 for controlling process conditions. For example, the control unit 280, may be configured to control flow of various process gases and purge gases from gas sources 238, 239, 240 through the valves 242A, 242B during different stages of a substrate process sequence. The control unit 280 may be coupled to another controller that is located adjacent individual chamber components, such as the programmable logic controllers 248A, 248B of the valves 242A, 242B. Bi-directional communications between the control unit 280 and various other components of the chamber 200 are handled through numerous signal cables collectively referred to as signal buses 288, some of which are illustrated in FIG. 3. In addition to control of process gases and purge gases from gas sources 238, 239, 240 and from the programmable logic controllers 248A, 248B of the valves 242A, 242B, the control unit 280 may be configured to be responsible for automated control of other activities used in wafer processing, such as wafer transport, temperature control, chamber evacuation, among other activities, some of which are described elsewhere herein.

In operation, a first gas flow may be injected into the expanding channel 234 of the chamber 200 by valve 242A together or separately (i.e., pulses) with a second gas flow injected into the chamber 200 by valve 242B. The first gas flow may comprise a continuous flow of a purge gas from purge gas source 240 and pulses of a precursor gas from precursor gas source 238 or may comprise pulses of a reactant gas from reactant gas source 239 and pulses of a purge gas from purge gas source 240. The flows of gas travel through the expanding channel 234 as a vortex flow pattern which provides a sweeping action across the inner surface of the expanding channel 234. The vortex flow pattern dissipates to a downwardly flow toward the surface of the substrate 210. The velocity of the gas flow reduces as it travels through the expanding channel 234. The gas flow then travels across the surface of the substrate 210 and across the bottom surface 260 of the chamber lid 232. The bottom surface 260 of the chamber lid 232, which is downwardly sloping, helps reduce the variation of the velocity of the gas flow across the surface of the substrate 210. The gas flow then travels by the choke 262 and into the pumping zone 266 of the chamber 200. Excess gas and by-products flow into the pumping channel 279 and are exhausted from the chamber 200 by a vacuum system 278. In one aspect, the gas flows proceed through the expanding channel 234 and between the surface of the substrate 210 and the bottom surface 260 of the chamber lid 232 proceeds in a laminar manner which aids in an efficient exposure of a reactant gas to the surface of the substrate 210 and efficient purging of inner surfaces of the chamber lid 232.

Examples

Figure 4:
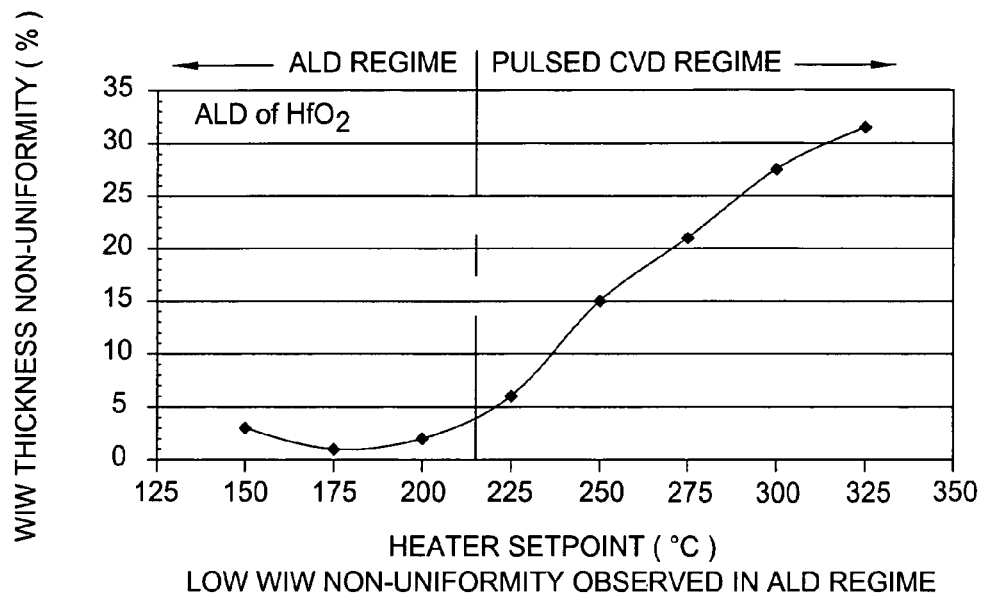
FIG. 4 shows the surprising uniformity of hafnium oxide films deposited by the present invention using TDEAH and further shows the substrate temperatures that produce uniform hafnium oxide films.

Hafnium oxide films were deposited at a chamber pressure of 4 Torr by pulsing TDEAH in a nitrogen carrier for 10 seconds. The chamber was then purged with a pulse of a nitrogen gas for 10 seconds. Next, reactive oxygen and an argon carrier (Ar/O* ratio=1:2) was pulsed to the chamber for 10 seconds. Once the reactive gas/carrier pulse was terminated, a second pulse of nitrogen gas was introduced into the chamber for ten seconds to complete the cycle. This process was repeated for 40 cycles with substrate temperatures ranging from 150° C. to 325° C. The resulting hafnium oxide films were tested for WIW Thickness Non-uniformity and the results are shown in FIG. 4. The results in FIG. 4 show that atomic layer deposition (ALD) occurred at substrate temperatures between 150° C. and about 225° C. while pulsed CVD occurred above 225° C. The ALD films showed excellent uniformity.

Figure 5:
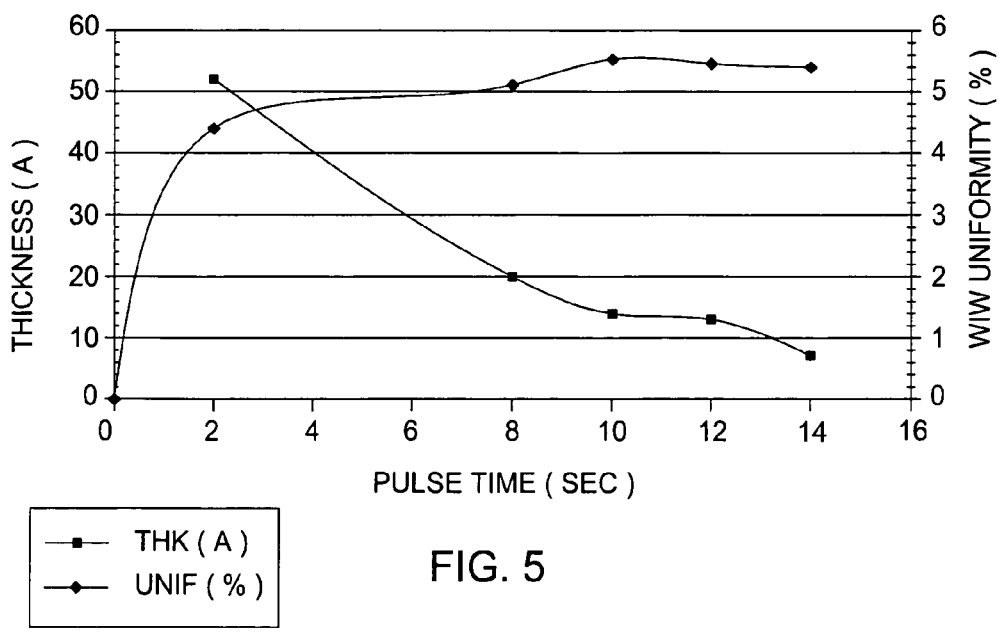
FIG. 5 shows the effect of pulse time on uniformity of the hafnium oxide film of the present invention.

Hafnium oxide films were then deposited at a chamber pressure of 4 Torr and a substrate temperature of 175° C. by pulsing TDEAH and a nitrogen carrier from 2 seconds to 14 seconds. After the TDEAH pulse, a nitrogen gas purge was pulsed into the chamber. For each cycle the nitrogen purge after the TDEAH/carrier pulse was the same length as the TDEAH/carrier pulse. Next, the nitrogen purge was terminated and a plasma of an argon carrier and oxygen (Ar/O* ratio=1:2) was pulsed to the chamber for 2 seconds to 14 seconds, matching the length of the TDEAH/carrier pulse. The cycle was then completed by a second nitrogen purge matching the length of the TDEAH/carrier pulse. The cycle was repeated 40 times and the resulting hafnium oxide films were measured for thickness, in addition to WIW Thickness Non-uniformity. The results are shown in FIG. 5 and show that pulse times from 10 to 14 seconds provide significant improvement in uniformity.

FIG. 6 shows an Auger analysis of atomic concentrations of a hafnium oxide film deposited at a substrate temperature of 175° C. Although not calibrated, the analysis shows that the film contained about 60 atomic percent of oxygen and about 40 atomic percent of hafnium, and did not contain detectable amounts of carbon. The atomic concentration of a hafnium oxide film prepared from the same precursor using a MOCVD process is shown in FIG. 7. The results in FIG. 7 show that the comparison film retained a measurable amount of carbon.

The hafnium oxide films of the invention have utility in conventional devices such as replacing the hafnium oxide films, forming hafnium oxide films, and forming mixed metal films containing hafnium oxide as described in the commonly assigned U.S. Pat. No. 6,858,547, filed Sep. 27, 2002.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

The invention claimed is:

1. A method for forming a hafnium-containing film on a substrate, comprising:
   providing a substrate within a process chamber;
   exposing the substrate to TDEAH and an oxygen-source compound during an ALD process to form a hafnium oxide layer thereon; and
   exposing the substrate to active nitrogen species generated by a remote plasma generator to form a nitride layer on the substrate.

2. The method of claim 1, wherein the oxygen-source compound is an active oxygen species.

3. The method of claim 1, wherein the process chamber contains an expanding channel for forming a process gas with a vortex flow pattern.

4. The method of claim 3, wherein the substrate is exposed to the process gas with the vortex flow pattern and the TDEAH and the oxygen-source compound are sequentially pulsed into the process gas.

5. A method for forming a hafnium-containing film on a substrate, comprising:
   exposing a substrate to a hafnium-containing compound within a process chamber;
   purging the process chamber with a purge gas;
   introducing an oxygen-source compound into the process chamber;
   purging the process chamber with the purge gas;
   introducing the hafnium-containing compound into the process chamber;
   purging the process chamber with the purge gas;
   introducing an active nitrogen species into the process chamber; and
   purging the process chamber with the purge gas.

6. The method of claim 5, wherein the oxygen-source compound is an active oxygen species.

7. The method of claim 6, wherein an oxygen-source gas comprises the oxygen-source compound and argon.

8. The method of claim 7, wherein the oxygen-source gas has an Ar:O ratio of 1:2.

9. The method of claim 8, wherein the process chamber is maintained at a pressure less than about 10 Torr.

10. The method of claim 5, wherein the hafnium-containing compound is TDEAH.

11. The method of claim 10, wherein the purge gas is selected from the group consisting of nitrogen, argon, helium and combinations thereof.

12. The method of claim 5, wherein the active nitrogen species are formed by a remote plasma generator.

13. The method of claim 5, wherein the process chamber contains an expanding channel for forming a process gas with a vortex flow pattern.

14. The method of claim 13, wherein the substrate is exposed to the process gas with the vortex flow pattern and the hafnium-containing compound and the oxygen-source compound are sequentially pulsed into the process gas.

15. A method for forming a hafnium-containing film on a substrate, comprising:
  exposing a substrate to a hafnium-containing compound within a process chamber;
  purging the process chamber with a purge gas;
  exposing the substrate to an oxygen-source gas containing an active oxygen species and argon;
  purging the process chamber with the purge gas;
  exposing the substrate to active nitrogen species; and
  purging the process chamber with the purge gas.

16. The method of claim 15, wherein the oxygen-source gas has an Ar:O ratio of 1:2.

17. The method of claim 16, wherein the process chamber is maintained at a pressure less than about 10 Torr.

18. The method of claim 15, wherein the active nitrogen species are formed by a remote plasma generator.

19. The method of claim 15, wherein the process chamber contains an expanding channel for forming a process gas with a vortex flow pattern.

20. The method of claim 19, wherein the substrate is exposed to the process gas with the vortex flow pattern and the hafnium-containing compound and the oxygen-source gas are sequentially pulsed into the process gas.

21. A method for forming a hafnium-containing film on a substrate, comprising:
  exposing a substrate to TDEAH within a process chamber;
  purging the process chamber with a purge gas;
  exposing the substrate to an oxygen-source compound;
  purging the process chamber with the purge gas;
  exposing the substrate to active nitrogen species; and
  purging the process chamber with the purge gas.

22. The method of claim 21, wherein the TDEAH is substantially free of solvents and excess ligands.

23. The method of claim 22, wherein the purge gas is selected from the group consisting of nitrogen, argon, helium and combinations thereof.

24. The method of claim 21, wherein the process chamber contains an expanding channel for forming a process gas with a vortex flow pattern.

25. The method of claim 24, wherein the substrate is exposed to the process gas with the vortex flow pattern and the TDEAH and the oxygen-source compound are sequentially pulsed into the process gas.

* * * * *

UNITED STATES PATENT AND TRADEMARK OFFICE
CERTIFICATE OF CORRECTION

PATENT NO.         : 7,067,439 B2
APPLICATION NO. : 10/247103
DATED               : June 27, 2006
INVENTOR(S)       : Metzner et al.

It is certified that error appears in the above-identified patent and that said Letters Patent is hereby corrected as shown below:

Column 5, Line 27: Change "slopping" to --sloping--

Column 6, Line 39: Change "steal" to --steel--

Column 6, Line 41: Change "steal" to --steel--

Signed and Sealed this

Ninth Day of January, 2007

JON W. DUDAS
*Director of the United States Patent and Trademark Office*